United States Patent [19]
Zook

[11] Patent Number: 5,465,260
[45] Date of Patent: Nov. 7, 1995

[54] DUAL PURPOSE CYCLIC REDUNDANCY CHECK

[75] Inventor: Christopher P. Zook, Boulder, Colo.

[73] Assignee: Cirrus Logic, Inc., Fremont, Calif.

[21] Appl. No.: 147,865

[22] Filed: Nov. 4, 1993

[51] Int. Cl.⁶ ............................ G06F 11/10; H03M 13/00
[52] U.S. Cl. .................... 371/37.7; 371/376; 371/38.1; 371/40.1
[58] Field of Search .................... 371/37.7, 37.4, 371/37.6, 38.1, 39.1, 40.1

[56] References Cited

U.S. PATENT DOCUMENTS

| | | | |
|---|---|---|---|
| 4,151,510 | 4/1979 | Howell et al. | 371/37.7 |
| 4,763,332 | 8/1988 | Glover | 371/37.5 |
| 4,777,635 | 10/1988 | Glover | 371/40.1 |
| 4,782,490 | 11/1988 | Tenengolts | 371/40.1 |
| 4,951,284 | 8/1990 | Abdel-Ghaffar et al. | 371/38.1 |
| 5,157,669 | 10/1992 | Yu et al. | 371/37.7 |
| 5,375,127 | 12/1994 | Leak et al. | 371/40.1 |
| 5,379,305 | 1/1995 | Weng | 371/41 |

*Primary Examiner*—Stephen M. Baker
*Attorney, Agent, or Firm*—Nixon & Vanderhye; Howard H. Sheerin; Greenlee and Winner

[57] ABSTRACT

Disclosed is a dual-purpose CRC generator which generates up to k CRC characters which can be used to extend the minimum distance of a three-way interleaved Reed-Solomon code by k and can also detect k random bit errors.

103 Claims, 5 Drawing Sheets

– – 5,465,260

DUAL PURPOSE CYCLIC REDUNDANCY CHECK

FIELD OF THE INVENTION

This invention relates generally to digital data communication systems, particularly to the detection of transmission errors by the use of codes.

RELATED PATENT APPLICATIONS

Patent applications filed concurrently herewith relating generally to the field of error correcting codes are U.S. patent application Ser. Nos. 08/148,068 "BURST ERROR CORRECTOR", 08/147,758 "FINITE FIELD INVERSION", and 08/147,650 "REED-SOLOMON DECODER".

BACKGROUND OF THE INVENTION

In a digital data communication system (including storage and retrieval from electronic memory, optical media or magnetic media) errors may occur as a result of noise, media defects or circuit failure. For reliable communications it is necessary to be reasonably sure of detecting all transmission errors. One way of doing this is by the use of cyclic redundancy check symbols or CRCs. In general CRCs are calculated by treating the data as the coefficients of a polynomial and dividing the data by another polynomial and keeping the remainder. The data and CRC together make up a codeword which is then transmitted into the communication channel. At the receiving end of the channel a CRC is again calculated and compared to the original. A discrepancy between the two CRCs indicates a transmission error.

In some applications the data and CRC together are coded into an error-correcting code by adding error-correcting characters (ECC). After a correction procedure has been used the CRC can be used to detect errors that are either not detected or are miscorrected by the corrector.

The data can be viewed as a sequence of binary bits or a sequence of multi-bit symbols. In general a bit-oriented CRC is desired if the expected errors are random bit errors and a symbol-oriented CRC is desired if the expected errors are burst errors or random symbol errors.

FIG. 1 shows a typical bit-oriented 8-bit CRC generator where the serial input is on the DATA line.

FIG. 2 shows a typical byte-oriented 8-bit CRC generator where $D_0$ to $D_7$ make up the input data byte.

FIG. 3 shows a data transmission system which includes a dynamic RAM (DRAM) for temporary storage and a communication channel which could be, for example, magnetic storage. The system uses an ECC system to correct errors occurring in the communication channel. It also employs a two-byte CRC to check for errors in data retrieved from the DRAM and to check the results of the corrector. For ECC purposes the data is partitioned into three interleaves. Each interleave makes up one ECC codeword containing two ECC bytes which can correct one byte in each interleave. This is a common technique for making a system capable of correcting a burst error of three bytes but using an ECC capable of correcting only one byte. Conceptually, during ECC generation, the first data byte goes into ECC generator 1, the second byte goes into ECC generator 2, the third byte goes into ECC generator 3, the fourth byte goes into ECC generator 1, etc. After the data has been input to the generators the first ECC byte comes from the generator which follows the generator which received the last data byte and the remaining ECC bytes are taken from the generators in the same sequence as previously described. All signal lines are 8 bits wide.

The generator in FIG. 1 will generate an 8-bit CRC character which can be used to detect any error which affects at most two bits in the serial data stream. If, however, the input data is the result of serializing a sequence of data bytes, it is not possible to detect every single-byte error.

The generator in FIG. 2 will generate an 8-bit CRC character which can be used to detect any single-byte error. It cannot, however, detect every two-bit error since the two errors could be in two different bytes.

The CRC in FIG. 3 will detect all two-byte errors (and consequently all two-bit errors) in a block of data read from the DRAM. However, regardless of which CRC and ECC polynomials are used it is possible to have three errors in one interleave which are not detected by the ECC or CRC.

SUMMARY OF THE INVENTION

It is an object of the present invention to provide a CRC generator/checker which can output a programmable number of CRC characters, i.e. it can output k bytes where k can range from 1 to n where n is a predetermined number.

Another object is that the aforementioned CRC generator/checker be capable of detecting all errors consisting of k bytes within a block of data, where k is the number of CRC bytes and each error affects a single bit in each byte.

A further object is that the aforementioned CRC generator/checker be capable of detecting all errors consisting of k+v bytes within an ECC interleave of a block of data, where k is the number of CRC bytes, v is the number of bytes in error which the ECC can detect (i.e. the number of ECC bytes in each interleave) and the data block is encoded into three interleaved Reed-Solomon codewords.

DETAILED DESCRIPTION OF THE INVENTION

Figure 1:
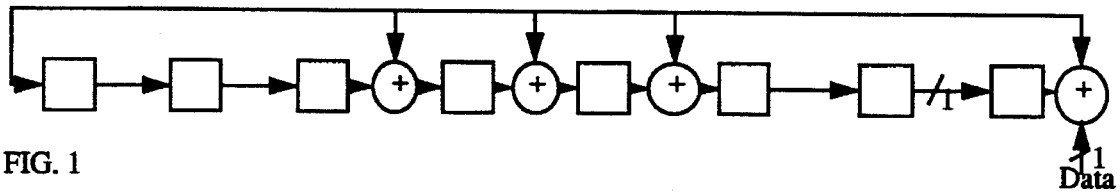
FIG. 1 shows a typical bit-oriented 8-bit CRC generator.
Figure 2:
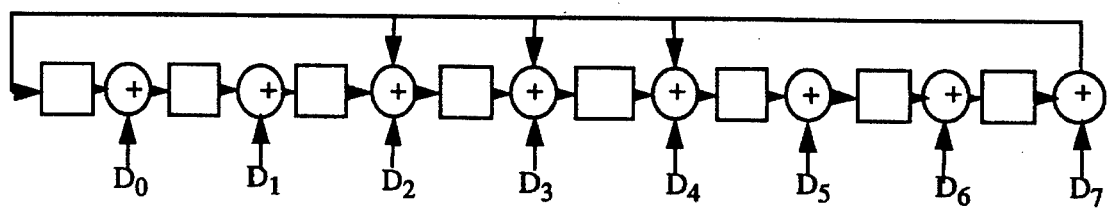
FIG. 2 shows a typical byte-oriented 8-bit CRC generator.
Figure 3:
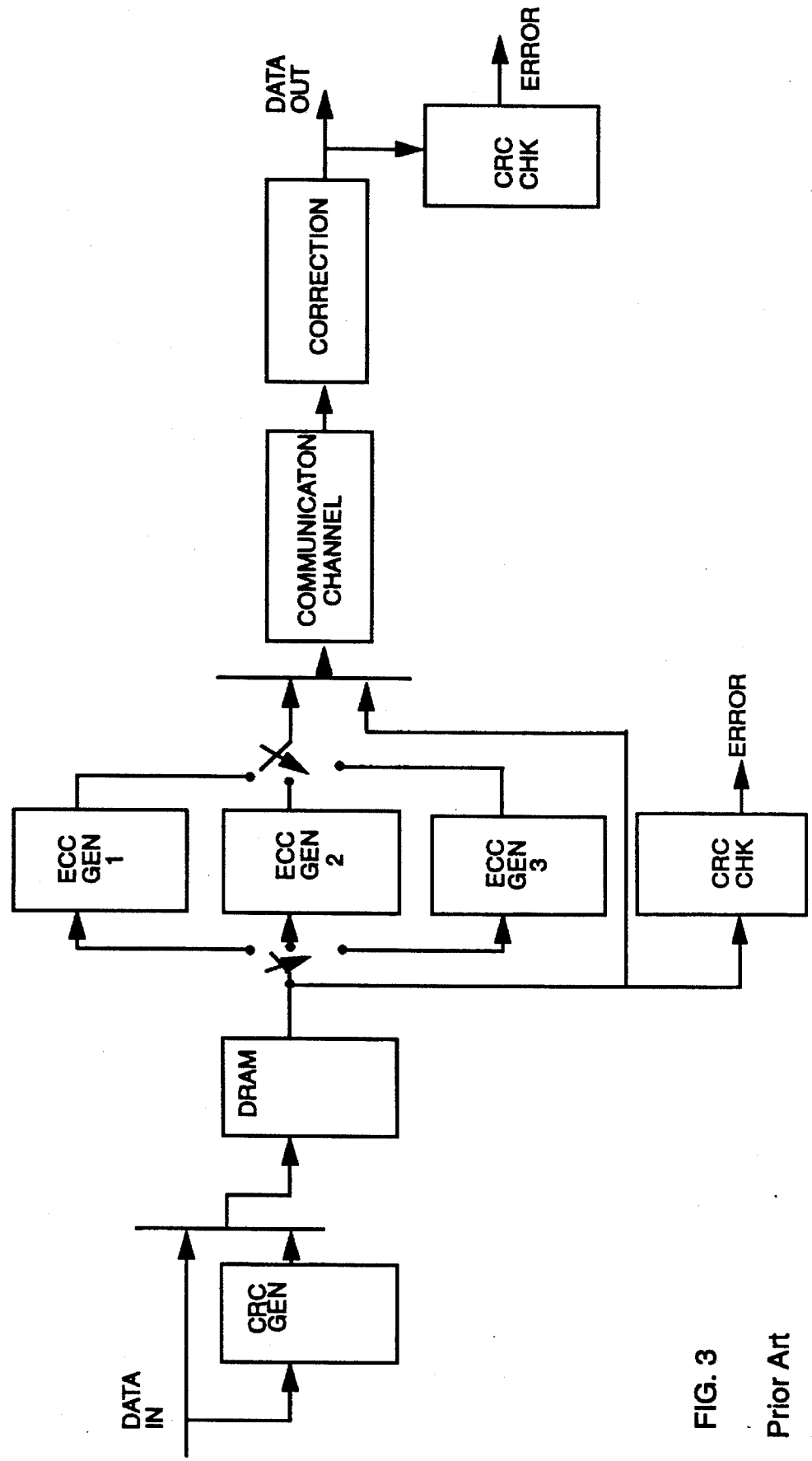
FIG. 3 shows a data path which includes a CRC generator and checker, a DRAM and a communication channel with ECC protection.
Figure 4:
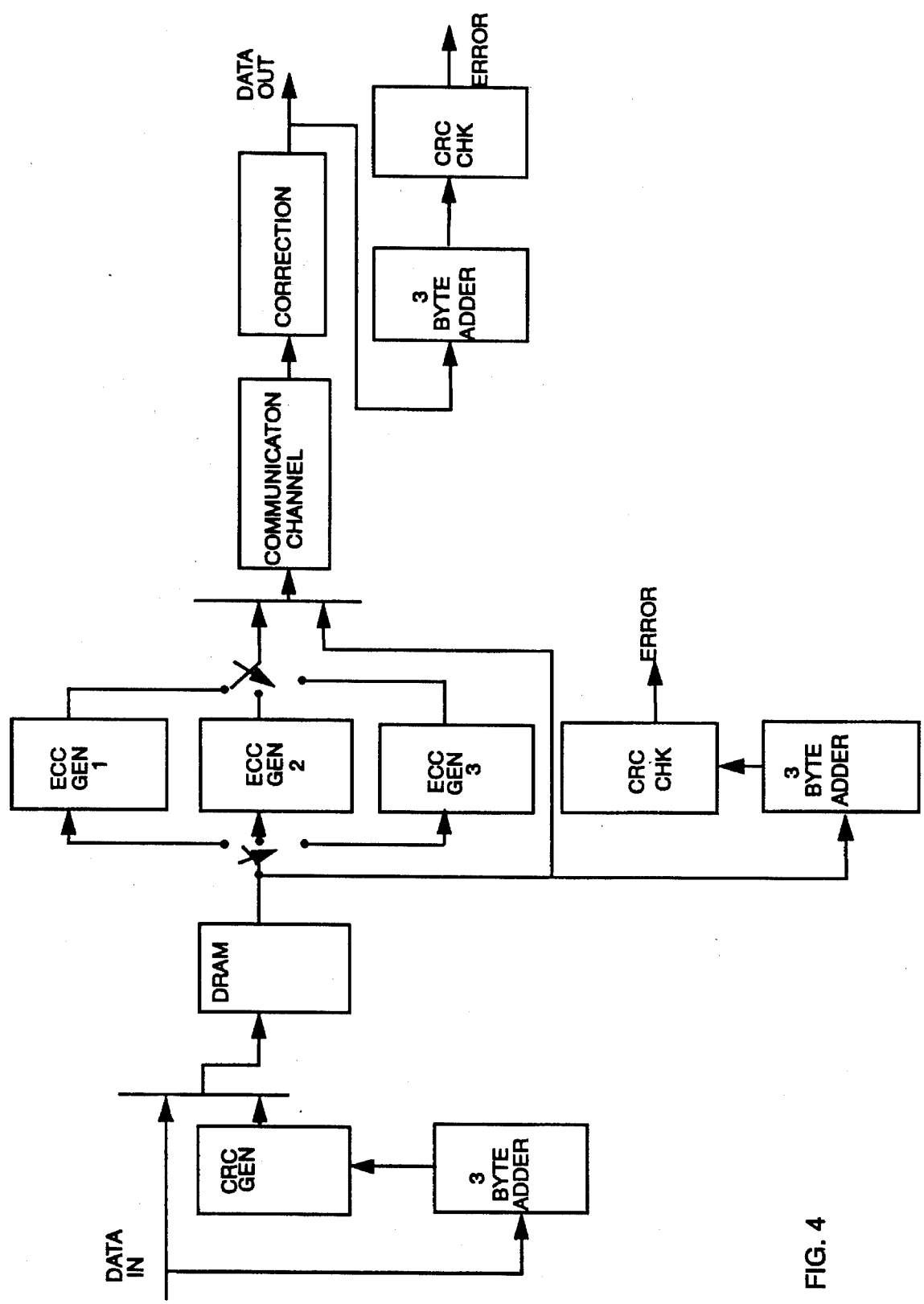
FIG. 4 shows the system of FIG. 3 but with adders at the input to the CRC generator and checkers in accordance with the invention.
Figure 6:
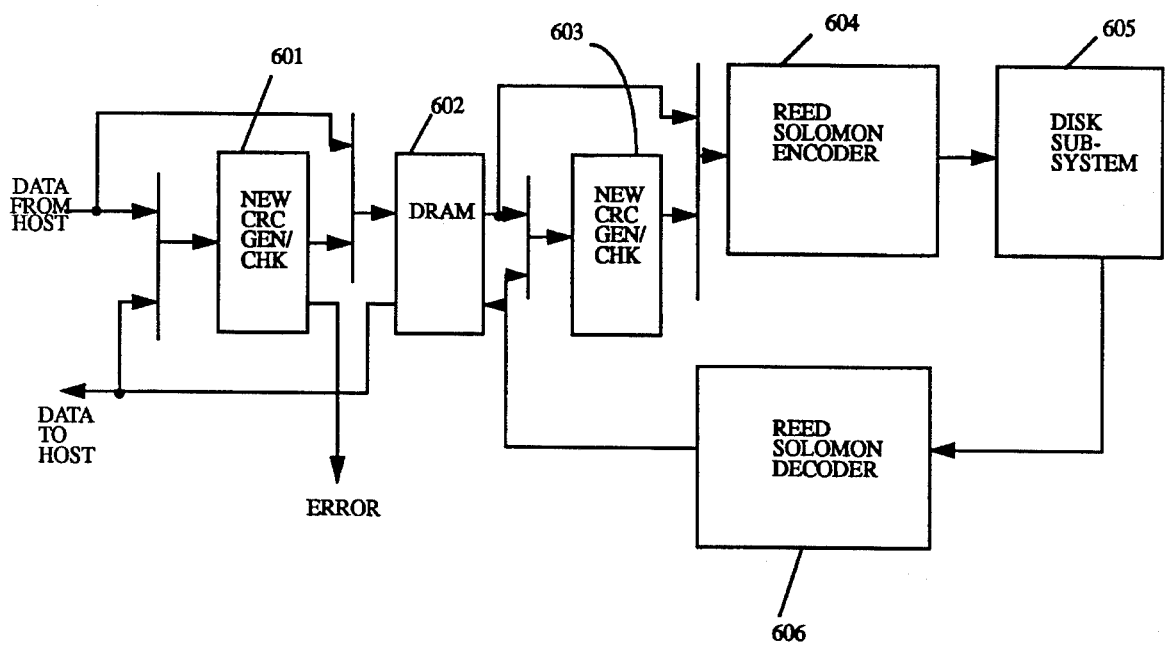
FIG. 6 is a block diagram of the invention in a disk drive application.

The invention includes a method and apparatus that is capable of generating and checking CRC bytes and which is order-programmable. As is shown in FIG. 4 and FIG. 6 the new CRC generator is used in conjunction with an ECC system which, in the preferred embodiment, is an three-way interleaved Reed-Solomon code. The CRC bytes are used to detect random errors occurring in DRAM and also to detect uncorrectable errors occurring in the communication channel. One embodiment of the invention is shown in FIG. 4 which shows a system similar to that shown in FIG. 3 except that the input data is segmented into groups of three bytes.

Figure 5:
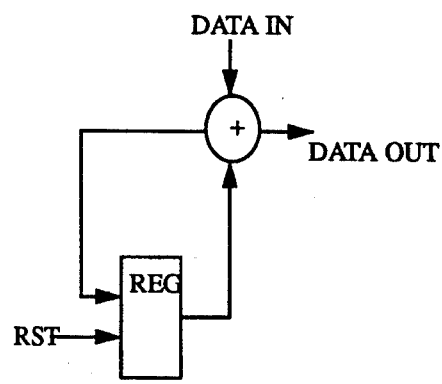
FIG. 5 shows the adder blocks of FIG. 4.

The sum of the three bytes in each group is sent to the CRC generator. The first byte in each group will ultimately be sent to ECC generator 1, the second byte in each group will ultimately will be sent to generator 2 and the third byte in each group will ultimately will be sent to generator 3. The CRC generator is only clocked once for each three bytes. FIG. 5 shows the detail of the three-byte adder in FIG. 4. In FIG. 5 the register resets on the third clock of each three-byte group.

FIG. 6 shows another embodiment in which a block of data from the host is sent to CRC generator/checker 601 and is written into DRAM 602. The CRC bytes are also written into the DRAM. At some later time the data and CRC are read from the DRAM to be sent to Reed-Solomon encoder 604 and then written to disk subsystem 605. At this same time the data block is sent to CRC generator/checker 603 to check for errors occurring in the DRAM. While the DRAM CRCs are being checked additional CRCs may be generated to be written to the disk along with the originals. This is because the data read from disk may require more protection than the DRAM data owing to the fact that data from disk is more susceptible to error than data from DRAM.

When the data block is read from the disk it is sent to Reed-Solomon decoder 606 and the corrected data is sent to CRC generator/checker 603 to check for uncorrectable errors and is also written into the DRAM. When the data block is retrieved from the DRAM and sent to the host it is again sent to CRC generator/checker 601 to check for DRAM errors.

The theory of operation of this invention is as follows: the data stream which feeds the new CRC generator is segmented into groups of three bytes. A linear combination of the three bytes is then sent to a collection of circuits which divide by $X+\alpha^{r+j}$ for $j=1, 2, \ldots, k$ where $\alpha$ is a primitive element of the field representation of the data bytes. In the preferred embodiment the field is GF(256). The linear combination may be a simple sum as shown in FIG. 4. This is simple to implement but it is possible to have two bytes each with a single bit error in a block of data read from the DRAM which are not detectable owing to the fact that if the same error is in two bytes of a three-byte group then the two errors will cancel when summed together before being sent to the CRC generator. Alternately the linear combination can be chosen so that if the three bytes in the group each have no more than a single "1" in each byte then the linear combination will be non-zero. In that case if every byte in error in a block of data contains only a single bit in error then k CRC bytes can be used to detect k bytes in error even if some of the bytes in error are in the same three-byte group. Using a linear combination of every three input bytes allows the CRC bytes to be generated in such a way as to increase the minimum distance of the ECC code by one for each CRC byte. This can be done because the ECC consists of three interleaves.

DETAILED EXPLANATION

The CRC bytes are generated according to the following rule:

Let the input bytes be denoted as $D_0$ to $D_{n-1}$. These bytes make up the coefficients of three polynomials, $F^0(x)$, $F^1(x)$ and $F^2(x)$, thusly:

$$F^s(x) = \sum_{k=0}^{t_s} D_{(3 \cdot k)+s} \cdot x^{t_0-k}$$

for $s=0, 1, 2$ where $t_s$ is the largest integer that is less than $(n-s)/3$. These polynomials represent the division of $D(x)$ into three groups, e.g. $D_0$ is in $F^0$, $D_1$ is in $F^1$, $D_2$ is in $F^2$, $D_3$ is in $F^0$, etc. These polynomials are precisely the same polynomials that are processed by the Reed-Solomon encoder to form the three Reed-Solomon code words. Define $G(x)$ as a linear combination of $F^0(x)$, $F^1(x)$ and $F^2(x)$ thusly:

$$G(x) = \sum_{s=0}^{2} M_s \cdot F^s(x)$$

The system in FIG. 4 corresponds to the case where the multipliers, $M_s$, are all 1. The system in FIG. 6 corresponds to the case where the $M_s$ are chosen so that $aM_0+bM_1+cM_3$ is non-zero as long as a, b and c each contain a single "1". The coefficients of $G(x)$ are linear combinations of three consecutive input bytes, e.g. the first coefficient of $G(x)$ is $D_0M_0+D_1M_1+D_2M_2$, the second coefficient of $G(x)$ is $D_3M_0+D_4M_1+D_5M_2$, etc.

The jth CRC byte, $C_j$, is defined as:

$$C_j = G(x) \bmod (x+\alpha^{r+j})$$

for $j=1, 2, \ldots, k$.

If only k or less of the input bytes $D_i$, were non-zero and the non-zero bytes each consisted of a single "1" then $G(x)$ would have at most k non-zero coefficients and $G(x)$ could not be zero. All of the CRC bytes are obtained by dividing $G(x)$ by consecutive powers of $\alpha$, and therefore if there are k CRC bytes then at least one of the CRC bytes would be non-zero. This is equivalent to saying that any set of k or less single-bit errors would be detected.

The Reed-Solomon code to be used in conjunction with the new CRC generator has a generator polynomial which has as roots v consecutive powers of $\alpha$, from $\alpha^{r-v+1}$ to $\alpha^r$. Let $E(x)$ be an error polynomial which has been added to one of the ECC interleaves, i.e. one of the Reed-Solomon code words. If the error is not detectable by the ECC then $E(x)$ must have roots which include $\alpha^{r-v+1}$ to $\alpha^r$. Since the factors used in CRC generation have as roots the k consecutive powers of $\alpha$, from $\alpha^{r+1}$ to $\alpha^{r+k}$, for the error not to be detected by the CRCs $M_sE(x)$ must have roots which include $\alpha^{r+1}$ to $\alpha^{r+k}$. This implies that $E(x)$ must have roots which include $\alpha^{r-v+1}$ to $\alpha^{r+k}$ which means that the error has more than k+v bytes in error.

Implementation

Figure 7:
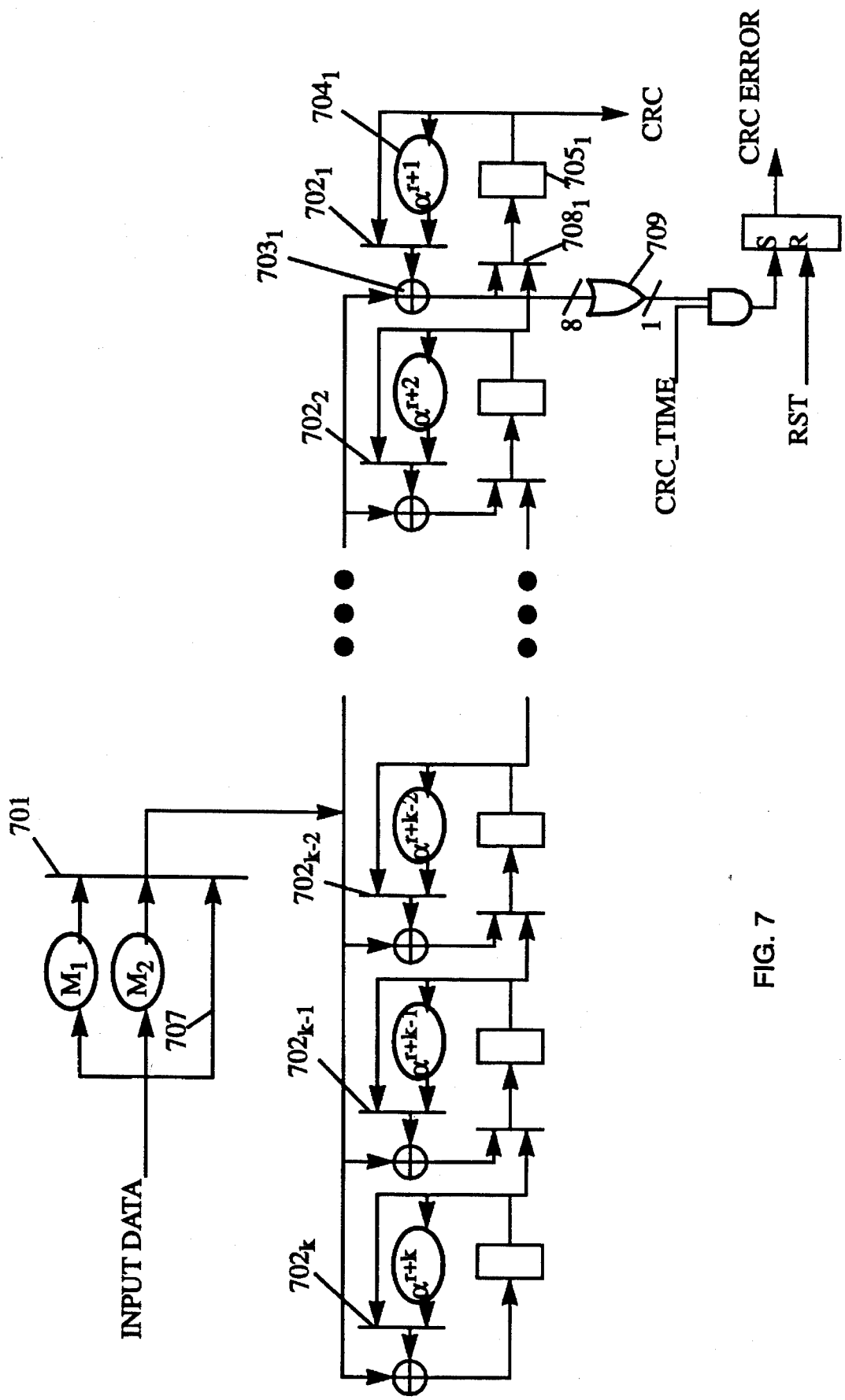
FIG. 7 is a block diagram of the CRC generator/checker in FIG. 6.

FIG. 7 is a block diagram of the new CRC generator/checker. Without loss of generality $M_0$ may always be selected as $\alpha^0$ and hence no multiplier is needed for $M_0$. The operation is as follows:

During the data portion of generation or checking MUX 701 supplies the dividers with the input data multiplied by $M_0$ (lead 707) on the first clock and on every third clock following the first, it supplies the dividers with the input data multiplied by $M_1$ on the second clock and on every third clock following the second and it supplies the dividers with the input data multiplied by $M_2$ on the third clock and on every third clock following the third. MUXes 702 supply adders 703 with the outputs of constant multipliers 704 on the first clock and on every third clock following the first and they supply the adders with the outputs of registers 705 on the other clocks. MUXes 708 supply the adder outputs to the register inputs.

During the CRC portion of CRC generation or checking, i.e. when CRC bytes are being input or output, MUXes 708 connect the registers into one shift register. During generation this allows the CRC bytes which reside in the registers to be shifted out and during checking it allows the incoming CRC bytes to be checked one at a time. It also allows the first j of the k CRC bytes to be checked followed by the shifting out of the remaining k-j CRC bytes for the case where only the first j CRC bytes are written into the DRAM but all k are written to disk. The checking of CRC bytes is accomplished by adding the incoming CRC bytes to the newly generated CRC bytes by adder $703_1$ and then detecting a non-zero byte with OR gate 709. While CRC bytes are being input to the checker the CRC_TIME signal is ON and then any miscompares will set CRC_ERROR latch. The order of the generator is programmable since the CRC bytes are calculated independently of each other and hence only the desired number of CRC bytes need be shifted out.

The set of M1 and M2 constants which cause $a+bM_1+cM_2$ to be non-zero for all a, b and c which have a single "1" is not unique. Therefore M1 and M2 are picked to satisfy that condition and to also cause linear combinations of other classes to be non-zero. For example, in the preferred embodiment the field generator polynomial is $X^8+X^5+X^4+X^3+1$. $M_1$ is chosen to be $\alpha^{25}$ and $M_2$ is chosen to be $\alpha^{112}$. This choice causes $a+bM_1+cM_2$ to be non-zero for the case where only two of the three bytes a, b and c are non-zero and the two bytes each have a single 3bit or shorter non-zero bit sequence. After adding this condition the choice of M1 and M2 is still not unique therefore an additional condition is added which is to maximize the number of two-byte combinations where each byte can have a single 4bit or shorter non-zero bit sequence. The $M_1$ and $M_2$ multipliers each consist of a set of XOR gates such that the output bits are linear combinations, i.e. XOR sums, of certain subsets of the input bits and these subsets are listed in Table I and Table II.

TABLE I

| $M_1$ multiplier |
| --- |
| OUT0 = IN0 + IN7 |
| OUT1 = IN0 + IN1 |
| OUT2 = IN1 + IN2 + IN7 |
| OUT3 = IN2 + IN3 + IN7 |
| OUT4 = IN3 + IN4 + IN7 |
| OUT5 = IN4 + IN5 |
| OUT6 = IN5 + IN6 |
| OUT7 = IN6 + IN7 |

TABLE II

| $M_2$ multiplier |
| --- |
| OUT0 = IN0 + IN1 + IN5 + IN6 + IN7 |
| OUT1 = IN1 + IN2 + IN6 + IN7 |

TABLE II-continued

| $M_2$ multiplier |
| --- |
| OUT2 = IN1 + IN2 + IN3 + IN5 + IN6 |
| OUT3 = IN1 + IN2 + IN3 + IN4 + IN5 |
| OUT4 = IN1 + IN2 + IN3 + IN4 + IN7 |
| OUT5 = IN2 + IN3 + IN4 + IN5 |
| OUT6 = IN3 + IN4 + IN5 + IN6 |
| OUT7 = IN0 + IN4 + IN5 + IN6 + IN7 |

For example, the CRC generator/checker of this invention has been illustrated in conjunction with a three-way interleaved Reed-Solomon code. It may alternately be employed with, for example, a two-way or four-way interleaved code. The principles taught with the illustrated CRC can be applied to a CRC for use in conjunction with encoders not limited to the Reed-Solomon design. The method of this invention can be used for codeword generation, codeword checking or both. It can be used between a computer host and a DRAM, between a DRAM and a magnetic disk, or between two ends of any communication channel. The same CRC can be used in more than one communication channel of a system, for example both between the host and a DRAM and between the DRAM and storage disk.

The CRC of this invention can be programmed to generate k CRC bytes. In conjunction with a Reed-Solomon code the CRC allows detection of k more errors than the Reed-Solomon code is capable of detecting. The number k can be tailored to the propensity for errors of a given communication channel. When the same CRC is used for more than one communication channel, different values of k can be selected for each channel. The CRC of this invention can also be utilized in a non-programmable embodiment having a fixed number of CRC bytes.

A hardware implementation of this invention has been illustrated. The CRC can also be implemented with software. Specific circuitry to implement the block diagram of FIG. 7 of this invention can be readily designed by a routiner in the electronic arts. Variations on the block diagram will also be apparent to those skilled in the art. Specific examples of a field generator polynomial and of the constant multipliers $M_s$ have been supplied. Other constants and polynomials can be chosen, as taught herein.

While the preferred embodiment has been disclosed and described in detail herein, it will be obvious to those skilled in the art that various changes in form and detail may be made therein without departing from the spirit and scope thereof.

What is claimed is:

1. A method for the machine encoding of a sequence of electrical signals representing a data stream; said stream being segmented into bytes where each byte is an element of the finite field $GF(2^p)$ and where p is the number of binary digits in each byte; said method enabling the detection of errors in said stream by using redundancy bytes in an m-way interleave scheme where at least one of the redundancy bytes is a cyclic redundancy code (CRC) byte and other redundancy bytes are error correcting code (ECC) bytes, said method comprising the steps of:

switching each successive data byte into an adder for adding m successive data bytes at a time;

adding each of said data bytes and sending the summations to a first CRC generator circuit wherein the summations are divided by a first order factor whose root is a next successive power of $\alpha$ in a division of said error correcting code to produce a CRC byte which is related to said error correcting code and wherein α is the primitive element of the finite field;

appending said CRC byte to said data stream;

inputting said data stream with said appended CRC byte to an m-way interleave circuit wherein two error correcting code (ECC) bytes are developed for each interleave by an ECC generator circuit associated with each interleave wherein the data bytes in each interleave are divided by successive first order factors of the error correcting code divisor;

incorporating the two ECC bytes developed for each of the m interleaves into said stream of signals;

wherein said two ECC bytes enable the detection of two errors in its associated interleave and the CRC byte related to said ECC bytes enables the detection of a third error in any one of said m-interleaves.

2. The method of claim 1 wherein said step of adding each of said data bytes further includes multiplying one of each m successive data bytes by a constant in a first multiplier circuit to ensure that single bit errors in different bytes making up a sum cannot cancel each other.

3. The method of claim 1 wherein the number of error correcting redundancy bytes produced by the ECC generator circuit in each interleave is programmable from 2 to v, wherein said method enables the detection of 2 to v errors or enables the correction of 2/2 to v/2 errors and where the CRC byte enables the detection of one additional error.

4. The method of claim 1 wherein the number of CRC bytes produced by said first CRC generator is programmable from one to k, wherein the capability of detecting errors not corrected by error correcting bytes is increased by one for each additional CRC byte and wherein each said additional CRC byte is generated by dividing by a factor whose root is a power of α, and wherein the capability of detecting errors in the data stream not corrected by error correcting bytes is increased by one for each additional CRC byte regardless of the interleave in which the error occurs.

5. The method of claim 4 wherein said step of adding each of said data bytes further includes multiplying one of each m successive data bytes by a constant in a first multiplier circuit to ensure that single bit errors in different bytes making up a sum cannot cancel each other.

6. The method of claim 5 wherein the number of error correcting redundancy bytes produced by the ECC generator circuit in each interleave is programmable from 2 to v, wherein said method enables the detection of 2 to v errors or enables the correction of 2/2 to v/2 errors and where the CRC byte enables the detection of one additional error.

7. The method of claim 1 wherein after appending said CRC byte to said data stream, said method further includes the steps of:

storing said data stream in a memory device;

upon retrieving said data stream with said appended CRC byte from said memory device, switching each successive data byte into a second adder for adding m successive data bytes at a time;

adding each of said data bytes and dividing the summation in a second CRC generator circuit to check for errors in said data stream.

8. The method of claim 7 wherein said step of adding each of said data bytes further includes multiplying one of each m successive data bytes by a constant in a second multiplier circuit to ensure that single bit errors in different bytes making up a sum cannot cancel each other.

9. The method of claim 7 wherein the number of CRC bytes produced by said second CRC generator is programmable from one to k, wherein the capability of detecting errors not corrected by error correcting bytes is increased by one for each additional CRC byte and wherein each said additional CRC byte is generated by dividing by a factor whose root is a power of α, and wherein the capability of detecting errors in the data stream not corrected by error correcting bytes is increased by one for each additional CRC byte regardless of the interleave in which the error occurs.

10. The method of claim 9 wherein said second step of adding each of said data bytes further includes multiplying one of each m successive data bytes by a constant in a second multiplier circuit to ensure that single bit errors in different bytes making up a sum cannot cancel each other.

11. The method of claim 9 wherein the number of CRC bytes produced by said first CRC generator is programmable from one to k, wherein the capability of detecting errors not corrected by error correcting bytes is increased by one for each additional CRC byte and wherein each said additional CRC byte is generated by dividing by a factor whose root is a power of α, and wherein the capability of detecting errors in the data stream not corrected by error correcting bytes is increased by one for each additional CRC byte regardless of the interleave in which the error occurs.

12. The method of claim 11 wherein the number of CRC bytes produced by said second CRC generator circuit is separately programmable from the number of CRC bytes produced by said first CRC generator circuit.

13. The method of claim 7 wherein the number of error correcting redundancy bytes in each interleave is programmable from 2 to v, wherein said method enables the detection of 2 to v errors or enables the correction of 2/2 to v/2 errors and where the CRC byte enables the detection of one additional error.

14. The method of claim 13 wherein the number of CRC bytes produced by said first CRC generator circuit and by said second CRC generator circuit are programmable from one to k and wherein each additional CRC byte is generated from a divisor including the next successive power of alpha.

15. The method of claim 14 wherein the number of CRC bytes produced by said second CRC generator circuit is separately programmable from the number of CRC bytes produced by said first CRC generator circuit.

16. The method of claim 15 wherein said step of second adding each of said data bytes further includes multiplying one of each m successive data bytes by a constant in a second multiplier circuit to ensure that single bit errors in different bytes making up a sum cannot cancel each other.

17. The method of claim 16 further including the steps of:

storing said data stream with appended CRC and ECC bytes in a storage medium;

upon retrieving said data stream with said appended bytes from said medium, processing said data stream to detect and correct errors in each interleave with ECC bytes associated with each interleave, wherein said CRC bytes enable the detection of errors in said data stream in excess of the errors corrected and/or detected by said ECC bytes.

18. Apparatus for detecting and correcting errors in a sequence of electrical digital signals representing a data stream, said stream being segmented into bytes where each byte is an element of the finite field $GF(2^p)$ and where p is the number of binary digits in each byte; said apparatus analyzing said data stream to produce redundancy bytes for correcting and/or detecting said errors through an m-way interleave scheme where at least one of the redundancy bytes is a cyclic redundancy code (CRC) byte and other redundancy bytes are error correcting code (ECC) bytes, said apparatus comprising:

a first m-way adder circuit;

first switching means for switching each successive data byte into said first m-way adder wherein said adder produces successive summations of m bytes at a time;

a first CRC generator wherein said successive summations are divided by a first order factor whose root is a power of $\alpha$ in a divisor of said error correcting code to produce a first CRC byte which is related to said error correcting code and wherein $\alpha$ is the primitive element of the finite field, and wherein the output of said first CRC generator is said data stream with said first CRC byte appended thereto;

an m-way interleave circuit connected to receive said data stream, said interleave circuit including an ECC generator in each interleave wherein two error correcting code (ECC) bytes are generated for each interleave, said ECC bytes being generated by dividing the data bytes in each interleave by successive first order factors of the error correcting code divisor, and wherein the output of said interleave circuit is said data stream with said CRC and ECC bytes appended thereto.

19. The apparatus of claim 18 further including a first multiplication circuit being connected to said first switching means wherein one of each m successive data bytes is multiplied by a constant, the output of said first multiplication circuit being connected to said first adder, said constant being chosen to ensure that single bit errors in different bytes making up a sum do not cancel each other.

20. The apparatus of claim 18 wherein the number of ECC bytes produced by said ECC generator in each interleave is programmable from 2 to v, wherein said apparatus enables the detection of 2 to v errors or enables the correction of 2/2 to v/2 errors and wherein the CRC byte enables the detection of one additional error in any interleave.

21. The apparatus of claim 18 wherein the number of CRC bytes produced by said first CRC generator is programmable from one to k, and wherein each additional CRC byte is generated by dividing with a factor including the next successive power of alpha.

22. The apparatus of claim 18 further including a dynamic random access memory (DRAM) connected to said first CRC generator wherein said data stream including said appended CRC byte is stored;

a second m-way adder circuit second switching means connected to the output of said DRAM for switching each successive data byte including said CRC byte into said second m-way adder circuit wherein said second m-way adder circuit produces successive summations of m bytes at a time;

a second CRC generator for detecting errors in the output of said DRAM, and wherein said second CRC generator further divides said successive summations of m bytes by the same first order factor used in said first CRC generator to check for errors in said data stream.

23. The apparatus of claim 22 wherein the number of ECC bytes produced by said ECC generator in each interleave is programmable from 2 to v, wherein said apparatus enables the detection of 2 to v errors or enables the correction of 2/2 to v/2 errors and wherein each CRC byte enables the detection of one additional error in any interleave.

24. The apparatus of claim 22 further including a second multiplication circuit being connected to said second switching means wherein one of each m successive data bytes is multiplied by a constant, the output of said second multiplication circuit being connected to said second adder, said constant being chosen to ensure that single bit errors in different bytes making up a sum do not cancel each other.

25. The apparatus of claim 24 further including a first multiplication circuit connected to said first switching means wherein one of each m successive data bytes is multiplied by a constant, the output of said first multiplication circuit being connected to said first adder, said constant being chosen to ensure that single bit errors in different bytes making up a sum do not cancel each other.

26. The apparatus of claim 22 wherein the number of CRC bytes produced by said first CRC generator is programmable from one to k, and wherein each additional CRC byte is generated by dividing with a factor including the next successive power of alpha.

27. The apparatus of claim 26 wherein the number of CRC bytes produced by said second CRC generator is separately programmable from the number of CRC bytes produced by said first CRC generator and wherein each additional CRC byte is generated by dividing with a factor including the next successive power of alpha.

28. The apparatus of claim 27 wherein a second multiplication circuit is connected to said second switching means wherein one of each m successive data bytes is multiplied by a constant, the output of said second multiplication circuit being connected to said second adder, said constant being chosen to ensure that single bit errors in different bytes making up a sum do not cancel each other.

29. The apparatus of claim 28 wherein a first multiplication circuit connected to said first switching means wherein one of each m successive data bytes is multiplied by a constant, the output of said first multiplication circuit being connected to said first adder, said constant being chosen to ensure that single bit errors in different bytes making up a sum do not cancel each other.

30. The apparatus of claim 29 wherein the number of ECC bytes produced by said ECC generator in each interleave is programmable from 2 to v, wherein said apparatus enables the detection of 2 to v errors or enables the correction of 2/2 to v/2 errors and wherein each CRC byte enables the detection of one additional error in any interleave.

31. The apparatus of claim 30 further including a storage medium connected to the output of said m-way interleave circuit for storing said data stream with said appended CRC bytes and said ECC bytes; and means for transmitting said data stream including said CRC bytes and ECC bytes from said storage medium to processing circuits for detecting and correcting errors wherein said CRC bytes enable the detection of errors in each said interleave in excess of the errors corrected and/or detected by said ECC bytes.

32. A method for the machine encoding of a sequence of electrical signals representing a data stream; said stream being segmented into bytes where each byte is an element of the finite field, $GF(2^p)$ and p is the number of binary digits in each byte; said method enabling the detection of errors in said stream by using redundancy bytes in an m-way interleave scheme where at least one of the redundancy bytes is a cyclic redundancy code (CRC) byte and other redundancy bytes are error correcting code (ECC) bytes, said method comprising the steps of:

providing an m-way interleave circuit with an ECC generator in each interleave for producing ECC bytes to detect burst type errors in said data stream;

relating said CRC bytes to said ECC bytes, said relating including the steps of:

generating said ECC bytes in each interleave with said ECC generator circuit utilizing first order factors of the error correcting code divisor;

generating said CRC byte with a CRC generator circuit utilizing a power of α wherein α is the primitive element of said finite field;

generating said CRC byte using the output of an adder circuit providing a summation of m successive data bytes at a time; and wherein said CRC byte enables the detection of a byte in error in any interleave in excess of those errors corrected and/or detected by said ECC bytes.

33. The method of claim 32 further including the step of enabling said CRC byte to detect single bit errors by multiplying one of each m successive data bytes by a constant prior to adding m data bytes in said adder circuit to ensure that single bit errors in different bytes making up a sum cannot cancel each other, wherein said CRC byte is capable of detecting single bit errors as well as detecting uncorrected burst errors.

34. The method of claim 33 wherein the number of CRC bytes produced by said first CRC generator is programmable from one to κ, wherein the capability of detecting errors not corrected by error correcting bytes is increased by one for each additional CRC byte and wherein each said additional CRC byte is generated by a factor whose root is the next successive power of alpha, and wherein the capability of detecting errors in the data stream not corrected by error correcting bytes is increased by one for each additional CRC byte regardless of the interleave in which the error occurs.

35. The method of claim 34 wherein the number of error correcting redundancy bytes produced by the ECC generator circuit in each interleave is programmable from 2 to v, wherein said method enables the detection of 2 to v errors or enables the correction of 2/2 to v/2 errors and wherein each CRC byte enables the detection of one additional error.

36. A method for the machine encoding of a sequence of electrical signals representing a data stream; said stream being segmented into bytes where each byte is an element of the finite field, $GF(2^p)$ and where p is the number of binary digits in each byte; said method enabling the detection of errors in said stream by using a cyclic redundancy code (CRC) byte, said method comprising the steps of:

switching each successive data byte into an adder for adding m successive data bytes at a time;

adding each of said data bytes and sending the summations to a first CRC generator circuit wherein the summations are divided by a first order factor whose root is a power of α in a cyclic redundancy code divisor to produce a CRC byte and wherein α is the primitive element of the finite field;

appending said CRC byte to said data stream;

wherein said CRC byte enables the detection of a single byte error in said data stream.

37. The method of claim 36 wherein said data stream with the appended CRC byte is stored in a storage device subject to single bit errors, said method further including the steps of:

upon retrieving said data stream with the appended CRC byte from said storage, switching each successive data byte into a second adder for adding m successive data bytes at a time;

adding each of said data bytes and dividing the summation in a second CRC generator by said first order factor used to generate said CRC byte in said first CRC generator to check for errors in said data stream.

38. The method of claim 36 wherein said step of adding each of said data bytes further includes multiplying one of each m successive data bytes by a constant in a first multiplier circuit to ensure that single bit errors in different bytes making up a sum cannot cancel each other.

39. The method of claim 38 wherein said data stream with the appended CRC byte is stored in a storage device subject to single bit errors, said method further including the steps of:

upon retrieving said data stream with the appended CRC byte from said storage, switching each successive data byte into a second adder for adding m successive data bytes at a time;

adding each of said data bytes and dividing the summation in a second CRC generator by said first order factor used to generate said CRC byte in said first CRC generator to check for errors in said data stream;

wherein said step of second adding each of said data bytes further includes multiplying one of each m successive data bytes by a constant in a second multiplier circuit to ensure that single bit errors in different bytes making up a sum cannot cancel each other.

40. The method of claim 36 wherein the number of CRC bytes produced by said first CRC generator is programmable from one to κ, wherein the capability of detecting errors in said data stream is increased by one for each additional CRC byte.

41. The method of claim 40 wherein said data stream with the appended CRC byte is stored in a storage device subject to single bit errors, said method further including the steps of:

upon retrieving said data stream with the appended CRC byte from said storage, switching each successive data byte into a second adder for adding m successive data bytes at a time;

adding each of said data bytes and dividing the summation in a second CRC generator by said first order factor used to generate said CRC byte in said first CRC generator to check for errors in said data stream;

wherein the number of CRC bytes produced by said second CRC generator is programmable from one to k, wherein the capability of detecting errors is increased by one for each additional CRC byte.

42. The method of claim 40 wherein said step of adding each of said data bytes further includes multiplying one of each m successive data bytes by a constant in a first multiplier circuit to ensure that single bit errors in different bytes making up a sum cannot cancel each other.

43. The method of claim 42 wherein said data stream with the appended CRC byte is stored in a storage device subject to single bit errors, said method further including the steps of:

upon retrieving said data stream with the appended CRC byte from said storage, switching each successive data byte into a second adder for adding m successive data bytes at a time;

adding each of said data bytes and dividing the summation in a second CRC generator said first order factor used to generate said CRC byte in said first CRC generator to check for errors in said data stream;

wherein said step of second adding each of said data bytes further includes multiplying one of each m successive data bytes by a constant in a second multiplier circuit to ensure that single bit errors in different bytes making up a sum cannot cancel each other; and wherein the number of CRC bytes produced by said second CRC generator is programmable from one to k, wherein the capability of detecting errors is increased by one for each additional CRC byte.

44. Apparatus for generating/checking a CRC byte where each byte is an element of the finite field GF(2P) and where p is the number of binary digits in each byte and is equal to the number of bits in each byte comprising:

a first m-way adder circuit;

first switching means for switching each successive data byte into said first m-way adder circuit wherein said first adder circuit produces successive summations of m bytes at a time; and a first CRC generator wherein said successive summations are divided by a first order factor whose root is a power of $\alpha$ in a cyclic redundancy code divisor to produce a CRC byte and wherein $\alpha$ is the primitive element of the finite field.

45. The apparatus of claim 44 further including a first multiplication circuit connected to said first switching means wherein one of each m successive data bytes is multiplied by a constant, the output of said first multiplication circuit being connected to said first adder, said constant being chosen to ensure that single bit errors in different bytes making up a sum do not cancel each other.

46. The apparatus of claim 44 wherein the number of CRC bytes produced by said first CRC generator is programmable from one to k, and wherein each additional CRC byte is generated by dividing with a factor including the next successive power of alpha.

47. The apparatus of claim 46 further including a first multiplication circuit connected to said first switching means wherein one of each m successive data bytes is multiplied by a constant, the output of said first multiplication circuit being connected to said first adder, said constant being chosen to ensure that single bit errors in different bytes making up a sum do not cancel each other.

48. The apparatus of claim 44 further including a dynamic access memory (DRAM) connected to said first CRC generator wherein said data stream including said appended CRC byte is stored;

a second m-way adder circuit;

second switching means connected to the output of said DRAM for switching each successive data byte including said CRC byte into said second m-way adder circuit wherein said second m-way adder circuit produces successive summations of m bytes at a time;

a second CRC generator for detecting errors in the output of said DRAM, and wherein said second CRC generator divides said successive summations of m bytes by the same factor used to generate said CRC byte in said first CRC generator to check for errors in said data stream.

49. The apparatus of claim 48 wherein the number of CRC bytes produced by said first CRC generator circuit and by said second CRC generator circuit are programmable from one to k.

50. The apparatus of claim 48 further including a first multiplication circuit connected to said first switching means wherein one of each m successive data bytes is multiplied by a constant, the output of said first multiplication circuit being connected to said first adder, said constants being chosen to ensure that single bit errors in different bytes making up a sum do not cancel each other; and a second multiplication circuit connected to said second switching means wherein one or ech m successive data bytes is multiplied by a constant, the output of said second multiplication circuit being connected to said second adder, said constant being chosen to ensure that single bit errors in different bytes making up a sum do not cancel each other.

51. The apparatus of claim 50 wherein the number of CRC bytes produced by said first CRC generator circuit and by said second CRC generator circuit are programmable from one to k.

52. Apparatus for detecting errors in a stream of electrical signals, said errors being induced by a first data handling or storage process, wherein said stream is organized in blocks of electrical signals representing digital data, each block containing n data symbols, wherein said block is mathematically represented by the polynomial $$D(x)=D_0 x^{n-1}+\ldots+D_{n-2}x+D_{n-1}$$

comprising:

a first group of CRC encoding circuits wherein, for each block of data, a CRC codeword signal including n input data symbols and k cyclic redundancy check CRC) symbols is produced, including:

a summing circuit connectable to receive said block of digital data, producing a signal represented by a linear sum G(x) of interleaved data symbols according to the function $$G(x) = \sum_{j=0}^{q} \left( \sum_{i=0}^{m-1} M_i \cdot D_{m \cdot j + i} \right) x^{q-j}$$

where m is the number of interleaves, $M_i$ is a multiplier, and q is the largest integer that is less than n/m;

a CRC signal generator circuit wherein k CRC symbols $C_j$ are generated according to the CRC function $$C_j = G(x) \bmod (x+\alpha^{r+j+1}) j=0, 1, 2, \ldots, k-1$$

where $\alpha$ is a primitive element whose powers generate all the non-zero elements of the finite field GF($2^p$), where p is the number of binary digits in each symbol, and r is an arbitrary integer set equal to the highest (or lowest, if the signs of all associated indices are changed) power of $\alpha$ when $\alpha$ is used in the generator polynomial for an error correcting code;

a CRC output circuit wherein signals represented by the CRC symbols $C_j$ and the data symbols $D_i$ are combined to form a signal represented by the polynomial $$H(x)=D_0 x^{n+k-1}+\ldots+D_{n-1}x^k+C_0 x^{k-1}+\ldots+C_{k-2}x+C_{k-1}$$

and output to the data handling or storage process.

53. The apparatus of claim 52, wherein the number k of said cyclic redundancy check symbols $C_j$ is programmable.

54. The apparatus of claim 52, wherein said summing circuit includes a multiplying circuit producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

55. The apparatus of claim 54 including CRC error checking circuits wherein a received signal H(x) produced by said CRC encoding circuits is evaluated, using said CRC function, for errors induced by a data handling or storage process, and an error signal produced if errors are detected.

56. The apparatus of claim 55 including a second group of CRC encoding circuits wherein, for each block of data, a second CRC codeword signal including n input data symbols and a k further cyclic redundancy check (CRC) symbols is produced, including:

a second summing circuit connectable to receive said blocks of digital data, producing a signal represented by a linear sum G(x) of interleaved data symbols according to the function $$G(x) = \sum_{j=0}^{q} \left( \sum_{i=0}^{m-1} D_{m \cdot j + i} \right) x^{q-j}$$

where m is the number of interleaves and q is the largest integer that is less than n/m;

a second CRC signal generator circuit wherein k CRC symbols $C_j$, are generated according to the CRC function $$C_j = G(x) \bmod (x + \alpha^{r-j+1}) \ j=0, 1, 2, \ldots k-1$$

where $\alpha$ is a primitive element whose powers generate all the non-zero elements of the finite field $GF(2^p)$ where p is the number of binary digits in each symbol, and r is an arbitrary integer (which is set equal to the highest power of $\alpha$ when $\alpha$ is used in the generator polynomial for an error correcting code);

a second CRC output circuit wherein signals represented by the CRC symbols $C_j$ and the data symbols $D_i$ are combined to form a signal represented by the polynomial $$H(x) = D_0 x^{n+k-1} + \ldots + D_{n-1} x^k + C_0 x^{k-1} + \ldots + C_{k-2} x + C_{k-1}$$

and output to the data handling or storage process.

57. The apparatus of claim 56, wherein the number k of said further cyclic redundancy check symbols $C_j$ is programmable.

58. The apparatus of claim 56, wherein said second summing circuit includes a second multiplying circuit producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

59. The apparatus of claim 58, wherein the number k of said further cyclic redundancy check symbols $C_j$ is programmable.

60. The apparatus of claim 52 including ECC encoding circuits wherein, for each block of data, an ECC codeword signal including n input data symbols, k CRC symbols, and m.v error correcting code (ECC) symbols is produced, including:

a segmenting circuit wherein said signal represented by the polynomial H(x) is interleaved into an integral number m of data groups, $I^s(x)$, according to the function $$I^s(x) = \sum_{i=0}^{q_s} H_{mi+s} x^{q-i} \ 0 \leq s < m$$

where $q_s$ is the largest integer that is less than (n-s)/m, thereby placing $H_0$ in $I^0$, $H_s$ in $I^s$, ..., $H_{m-1}$ in $I^{m-1}$ and then $H_m$ in $I^0$, $H_{m+s}$ in $I^s$, etc.;

ECC signal generating circuits wherein a v-symbol Reed-Solomon error correcting code is generated from each of the m data groups $I^s(x)$, said generating circuits using an ECC generator polynomial having as roots v consecutive powers of $\alpha$, from $\alpha^{r-v+1}$ to $\alpha^r$;

output circuits wherein signals represented by said polynomial H(x) and m.v error correcting code symbols are catenated to form a transmitted-data signal and sent to a data handling or data storage process.

61. The apparatus of claim 60, wherein the number v of error correcting code symbols generated from each of the m data groups $I^s(x)$ is programmable.

62. The apparatus of claim 60, wherein the number k of said cyclic redundancy check symbols $C_j$ is programmable.

63. The apparatus of claim 62, wherein the number v of error correcting code symbols generated from each of the m data groups $I^s(x)$ is programmable.

64. The apparatus of claim 62, wherein said summing circuit includes a multiplying circuit producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

65. The apparatus of claim 64, wherein the number v of error correcting code symbols generated from each of the m data groups $I^s(x)$ is programmable.

66. The apparatus of claim 64 including CRC error checking circuits wherein a received signal H(x) produced by said CRC encoding circuits is evaluated, using said CRC function, for errors induced by a data handling or storage process, and an error signal produced if errors are detected.

67. The apparatus of claim 66, wherein the number v of error correcting code symbols generated from each of the m data groups $I^s(x)$ is programmable.

68. The apparatus of claim 66 including a second group of CRC encoding circuits wherein, for each block of data, a CRC codeword signal including n input data symbols and a second number of k cyclic redundancy check (CRC) symbols is produced, including:

a second summing circuit connectable to receive said blocks of digital data, producing a signal represented by a linear sum G(x) of interleaved data symbols according to the function $$G(x) = \sum_{j=0}^{q} \left( \sum_{i=0}^{m-1} D_{m \cdot j + i} \right) x^{q-j}$$

where m is the number of interleaves, and q is the largest integer that is less than n/m;

a second CRC signal generator circuit wherein k CRC symbols $C_j$ are generated according to the CRC function $$C_j = G(x) \bmod (x + \alpha^{r+j+1}) \; j = 0, 1, 2, \ldots, k-1$$

where $\alpha$ is a primitive element whose powers generate all the non-zero elements of the finite field $GF(2^p)$ where p is the number of binary digits in each symbol, and r is an arbitrary integer (which is set equal to the highest power of $\alpha$ when $\alpha$ is used in the generator polynomial for an error correcting code);

a second CRC output circuit wherein signals represented by the CRC symbols $C_j$ and the data symbols $D_i$ are combined to form a signal represented by the polynomial $$H(x) = D_0 x^{n+k-1} + \ldots + D_{n-1} x^k + C_0 x^{k-1} + \ldots + C_{k-2} x + C_{k-1}$$

and output to the data handling or storage process.

69. The apparatus of claim 68, wherein the number v of error correcting code symbols generated from each of the m data groups $I^s(x)$ is programmable.

70. The apparatus of claim 68, wherein the number k of said further cyclic redundancy check symbols $C_j$ is programmable.

71. The apparatus of claim 70, wherein the number v of error correcting code symbols generated from each of the m data groups $I^s(x)$ is programmable.

72. The apparatus of claim 68, wherein said second summing circuit includes a multiplying circuit producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

73. The apparatus of claim 72, wherein the number v of error correcting code symbols generated from each of the m data groups $I^s(x)$ is programmable.

74. The apparatus of claim 73, wherein said first group of CRC encoding circuits receives data from a host system and provides its output to a volatile storage device and wherein said second group of CRC encoding circuits receives data from said volatile storage device and provides its output to said ECC circuits and wherein said ECC circuits provide output to a non-volatile storage device.

75. The apparatus of claim 74, wherein said CRC error checking circuits detect errors induced by said volatile storage device.

76. The apparatus of claim 75, including error correction circuits wherein a data block received from said non-volatile data storage device is interleaved into m data groups $I^s(x)$ and further wherein said m data groups are used with said ECC generator polynomial to correct up to mv/2 symbol errors, limited to v/2 symbol errors in each of said m data groups, in each said data block.

77. The apparatus of claim 76, wherein said CRC error checking circuits also detect uncorrected errors induced by said non-volatile storage device.

78. Apparatus for detecting errors in a stream of electrical signals, said errors being induced by a first data handling or storage process, wherein said stream is organized in blocks of electrical signals representing digital data, each block containing n data symbols, wherein said block is mathematically represented by the polynomial $$D(x) = D_0 x^{n-1} + \ldots + D_{n-2} x + D_{n-1}$$

comprising:
a first CRC encoding means wherein, for each block of data, a CRC codeword signal including n input data symbols and k cyclic redundancy check (CRC) symbols is produced, including:
summing means connectable to receive said block of digital data, for producing a signal represented by a linear sum G(xJ of interleaved data symbols according to the function $$G(x) = \sum_{j=0}^{q} \left( \sum_{i=0}^{m-1} D_{m \cdot j + i} \right) x^{q-j}$$

where m is the number of interleaves, and q is the largest integer that is less than n/m;

CRC signal generating means for producing k CRC symbols $C_j$ according to the CRC function $$C_j = G(x) \bmod (x + \alpha^{r+j+1}) \; j = 0, 1, 2, \ldots k-1$$

where $\alpha$ is a primitive element whose powers generate all the non-zero elements of the finite field $GF(2^p)$, where p is the number of binary digits in each symbol, and r is an arbitrary integer set equal to the highest (or lowest, if the signs of all associated indices are changed) power of $\alpha$ when $\alpha$ is used in the generator polynomial for an error correcting code;

CRC output means for combining signals represented by the CRC symbols $C_j$ and the data symbols $D_i$ to form a signal represented by the polynomial $$H(x) = D_0 x^{n+k-1} + \ldots + D_{n-1} x^k + C_0 x^{k-1} + \ldots + C_{k-2} x + C_{k-1}$$

and for providing the signal represented by H(x) as output to a data handling or storage process.

79. The apparatus of claim 78, wherein the number k of said cyclic redundancy check symbols $C_j$ is programmable.

80. The apparatus of claim 78, wherein said summing means includes multiplying means for producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

81. The apparatus of claim 80 including CRC error checking means for evaluating a received signal H(x) produced by said CRC encoding means, using said CRC function, for errors induced by a data handling or storage process, and for producing an error signal if errors are detected.

82. The apparatus of claim 81, wherein the number k of said further cyclic redundancy check symbols $C_j$ is programmable.

83. The apparatus of claim 81 including a second CRC encoding means for producing, for each block of data, a second CRC codeword signal including n input data symbols and a second k cyclic redundancy check (CRC) symbols, including:

a second summing means connectable to receive said blocks of digital data, for producing a signal represented by a linear sum G(x) of interleaved data symbols according to the function $$G(x) = \sum_{j=0}^{q} \left( \sum_{i=0}^{m-1} D_{m \cdot j + i} \right) x^{q-j}$$

where m is the number of interleaves and q is the largest integer that is less than n/m;

second CRC signal generating means for producing k CRC symbols $C_j$ according to the CRC function $$C_j = G(x) \bmod (x + \alpha^{r-j+1}) \quad j=0, 1, 2, \ldots k-1$$

where $\alpha$ is a primitive element whose powers generate all the non-zero elements of the finite field $GF(2^p)$ where p is the number of binary digits in each symbol, and r is an arbitrary integer set equal to the highest (or lowest, if the signs of all associated indices are changed) power of $\alpha$ when $\alpha$ is used in the generator polynomial for an error correcting code;

second CRC output means for combining signals represented by the CRC symbols $C_j$ and the data symbols $D_i$ to form a signal represented by the polynomial $$H(x) = D_0 x^{n+k-1} + \ldots + D_{n-1} x^k + C_0 x^{k-1} + \ldots + C_{k-2} + C_{k-1}$$

and for providing the signal represented by H(x) as output to a data handling or storage process.

84. The apparatus of claim 83, wherein said second summing means includes second multiplying means for producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i A_i \neq 0.$$

85. The apparatus of claim 83, wherein the number k of said further cyclic redundancy check symbols $C_j$ is programmable.

86. The apparatus of claim 78 including ECC encoding means for producing, for each block of data, an ECC codeword signal including n input data symbols, k CRC symbols, and m.v error correcting code (ECC) symbols, including:

segmenting means for interleaving said signal represented by the polynomial H(x) into an integral number m of data groups, $I^s(x)$, according to the function $$I^s(x) = \sum_{i=0}^{q_s} H_{mi+s} x^{q_s - i} \quad 0 \leq s < m$$

where $q_s$ is the largest integer that is less than (n-s)/m, thereby placing $H_0$ in $I^0$, $H_s$ in $I^s$, ... $H_{m-1}$ in $I^{m-1}$ and then $H_m$ in $I^0$, $H_{m+s}$ in $I^s$, etc.;

ECC signal generating means for generating a v-symbol Reed-Solomon error correcting code from each of the m data groups $I^s(x)$, said generating means using an ECC generator polynomial having as roots v consecutive powers of $\alpha$, from $\alpha^{r-v+1}$ to $\alpha^r$;

ECC output means for catenating signals represented by said polynomial H(x) and m.v error correcting code symbols to form a transmitted-data signal and for sending said transmitted-data signal a data handling or data storage process.

87. The apparatus of claim 86, wherein the number v of error correcting code symbols generated from each of the m data groups $I^s(x)$ is programmable.

88. The apparatus of claim 86, wherein the number k of said cyclic redundancy check symbols $C_j$ is programmable.

89. The apparatus of claim 88, wherein the number v of error correcting code symbols generated from each of the m data groups $I^s(x)$ is programmable.

90. The apparatus of claim 88, wherein said summing means includes multiplying means for producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

91. The apparatus of claim 90, wherein the number v of error correcting code symbols generated from each of the m data groups $I^s(x)$ is programmable.

92. The apparatus of claim 90 including error checking means for evaluating a received signal H(x) produced by said CRC encoding means, using said CRC function, for errors induced by a data handling or storage process, and for producing an error signal if errors are detected.

93. The apparatus of claim 92, wherein the number v of error correcting code symbols generated from each of the m data groups $I^s(x)$ is programmable.

94. The apparatus of claim 92 including a second CRC encoding means for producing, for each block of data, a CRC codeword signal including n input data symbols and a number k of further cyclic redundancy check (CRC) symbols, including:

second summing means connectable to receive said blocks of digital data, for producing a signal represented by a linear sum G(x) of interleaved data symbols according to the function $$G(x) = \sum_{j=0}^{q} \left( \sum_{i=0}^{m-1} D_{m \cdot j + i} \right) x^{q-j}$$

where m is the number of interleaves and q is the largest integer that is less than n/m;

second CRC signal generating means for producing k CRC symbols $C_j$ according to the CRC function $$C_j = G(x) \bmod (x + \alpha^{r+j+1}) \ j = 0, 1, 2, \ldots k-1$$

where $\alpha$ is a primitive element whose powers generate all the non-zero elements of the finite field $GF(2^p)$ where p is the number of binary digits in each symbol, and r is an arbitrary integer set equal to the highest (or lowest, if the signs of all associated indices are changed) power of $\alpha$ when $\alpha$ is used in the generator polynomial for an error correcting code;

second CRC output means for combining signals represented by the CRC symbols $C_j$ and the data symbols $D_i$ to form a signal represented by the polynomial $$H(x) = D_0 x^{n+k-1} + \ldots + D_{n-1} x^k + C_0 x^{k-1} + \ldots C_{k-2} x + C_{k-1}$$

and for providing the signal represented by H(x) as output to a data handling or storage process.

95. The apparatus of claim 94, wherein the number v of error correcting code symbols generated from each of the m data groups $I^s(x)$ is programmable.

96. The apparatus of claim 94, wherein the second number k of said cyclic redundancy check symbols $C_j$ is programmable.

97. The apparatus of claim 96, wherein the number v of error correcting code symbols generated from each of the m data groups $I^s(x)$ is programmable.

98. The apparatus of claim 94, wherein said second summing means includes multiplying means for producing a signal represented by a linear combination G(x) of data symbols according to the function $$G(x) = \sum_{j=0}^{q} \left( \sum_{i=0}^{m-1} M_i \cdot D_{m \cdot j + i} \right) x^{q-j}$$

where the multiplying values $M_i$ are chosen such that for any arbitrary symbols $A_i$ each containing a single binary 1

$$\sum_{i=0}^{m-1} M_i \cdot A_i \neq 0.$$

99. The apparatus of claim 98, wherein the number v of error correcting code symbols generated from each of the m data groups $I^s(x)$ is programmable.

100. The apparatus of claim 99, including means for said first CRC encoding means receiving data from a host system and providing its output to a volatile storage device and means for said second CRC encoding means receiving data from said volatile storage device and providing its output to said ECC means and further means for said ECC means to provide output to a non-volatile storage device.

101. The apparatus of claim 100, including means for said CRC error checking means to detect errors induced by said volatile storage device.

102. The apparatus of claim 101, including error correction means for interleaving a data block received from said non-volatile data storage device into m data groups $I^s(x)$ and for using said m data groups with said ECC generator polynomial to correct up to mv/2 symbol errors, limited to v/2 symbol errors in each of said m data groups, in each said data block.

103. The apparatus of claim 102, including means for said CRC error checking means to also detect uncorrected errors induced by said non-volatile storage device.

* * * * *